US009535341B2

(12) United States Patent
De Winter et al.

(10) Patent No.: US 9,535,341 B2
(45) Date of Patent: Jan. 3, 2017

(54) METHOD FOR A LITHOGRAPHIC APPARATUS

(75) Inventors: Laurentius Cornelius De Winter, Vessem (NL); Jozef Maria Finders, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 2050 days.

(21) Appl. No.: 12/617,855

(22) Filed: Nov. 13, 2009

(65) Prior Publication Data
US 2010/0123887 A1    May 20, 2010

Related U.S. Application Data

(60) Provisional application No. 61/193,321, filed on Nov. 17, 2008.

(51) Int. Cl.
G03B 27/52    (2006.01)
G03F 7/20    (2006.01)

(52) U.S. Cl.
CPC ....... *G03F 7/70891* (2013.01); *G03F 7/70125* (2013.01); *G03F 7/70308* (2013.01); *G03F 7/70591* (2013.01); *G03F 7/70641* (2013.01)

(58) Field of Classification Search
CPC .... B23K 20/227; B23P 19/042; C21D 10/005; C21D 1/09; C21D 2261/00; C21D 9/04; C22C 38/001; C22C 38/002; C22C 38/02; C22C 38/04; C22C 38/06; C22C 38/14; F02M 2200/8084; F02M 55/025; F02M 63/00
(Continued)

(56) References Cited

U.S. PATENT DOCUMENTS 5,144,362 A    9/1992    Kamon et al.
6,261,727 B1    7/2001    Wang
(Continued)

FOREIGN PATENT DOCUMENTS

JP    07-147222    6/1995
JP    2002-289494    10/2002
(Continued)

OTHER PUBLICATIONS

Japanese Office Action mailed Nov. 15, 2011 in corresponding Japanese Patent Application No. 2009-256616.

*Primary Examiner* — Deoram Persaud
(74) *Attorney, Agent, or Firm* — Pillsbury Winthrop Shaw Pittman LLP

(57) ABSTRACT

A method is described that includes illuminating a patterning device pattern with a radiation beam having a symmetric illumination mode, the patterning device pattern comprising a first pattern feature that substantially diffracts radiation of the radiation beam, and a second pattern feature that does not substantially diffract radiation of the radiation beam, introducing an asymmetry, relative to an optical axis, in the substantially diffracted radiation using a phase modulation element, illuminating a radiation beam receiving element with radiation emanating from the phase modulation element to form a receiving element pattern that is related to the patterning device pattern, the receiving element pattern having first and second receiving element pattern features related to the first and second pattern features respectively, and determining information at least indicative of a focal property from positional information regarding the relative positions of the first and second receiving element pattern features.

7 Claims, 9 Drawing Sheets

(58) Field of Classification Search
USPC .................................................... 355/53, 55
See application file for complete search history.

(56) References Cited

U.S. PATENT DOCUMENTS

| | | |
|---|---|---|
| 6,633,390 B2 | 10/2003 | Shiode et al. |
| 6,764,794 B2 | 7/2004 | Nakao et al. |
| 6,797,443 B2 | 9/2004 | Nakao et al. |
| 6,811,939 B2 | 11/2004 | Nakao et al. |
| 7,502,097 B2 | 3/2009 | Hauschild |
| 7,518,706 B2 | 4/2009 | Hauschild et al. |
| 2002/0008863 A1 | 1/2002 | Taniguchi et al. |
| 2002/0015158 A1 | 2/2002 | Shiode et al. |
| 2002/0195539 A1 | 12/2002 | Nakao et al. |
| 2003/0031943 A1 | 2/2003 | Nakao et al. |
| 2003/0073009 A1 | 4/2003 | Nakao et al. |
| 2003/0117627 A1 | 6/2003 | Sato et al. |
| 2005/0146701 A1 | 7/2005 | Holderer et al. |
| 2006/0141375 A1 | 6/2006 | Hauschild et al. |
| 2006/0146302 A1 | 7/2006 | Hauschild |
| 2007/0291244 A1* | 12/2007 | Chang et al. ................... 355/67 |
| 2008/0123066 A1 | 5/2008 | Jansen et al. |

FOREIGN PATENT DOCUMENTS

| | | |
|---|---|---|
| JP | 2003-007598 | 1/2003 |
| JP | 2003-057800 | 2/2003 |
| JP | 2003-121993 | 4/2003 |
| JP | 2004-103674 | 4/2004 |
| JP | 2004-140223 | 5/2004 |
| JP | 2006-186368 | 7/2006 |
| JP | 2006-191046 | 7/2006 |

\* cited by examiner

METHOD FOR A LITHOGRAPHIC APPARATUS

This application claims priority and benefit under 35 U.S.C. §119(e) to U.S. Provisional Patent Application No. 61/193,321, entitled "Method For A Lithographic Apparatus", filed on Nov. 17, 2008. The content of that application is incorporated herein in its entirety by reference.

FIELD

The present invention relates to a method for a lithographic apparatus. In particular, the present invention relates to a method of obtaining information at least indicative of a focal property of a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In the semiconductor manufacturing industry, there is an increasing demand for ever-smaller features and increased density of features. Critical dimensions (CDs) of pattern features are therefore rapidly decreasing, and are becoming very close to the theoretical resolution limit of state-of-the-art lithographic apparatus such as the steppers and scanners as described above. Conventional techniques for enhancing resolution and minimizing patternable critical dimension include: reducing the wavelength of the exposure radiation; increasing the numerical aperture of the projection system of the lithographic apparatus; and including features smaller than the resolution limit of the lithographic apparatus so that they will not be patterned onto the substrate, but so that they will produce diffraction effects which can improve contrast and sharpen fine features of patterns applied to the substrate. However, application of such conventional resolution enhancement techniques may lead to a reduction of depth of focus within which, for example, imaging of desired patterns at or near the limit of the resolution capability can be achieved. A reduced depth of focus may lead to pattern defects (for example, the blurring of lines or edges of pattern features) beyond tolerance when, for example, a residual substrate unflatness cannot be compensated for during exposure of the substrate. Alternatively or additionally, it is often desirable to be able to determine and/or set to a high degree of accuracy the focal point of the lithographic apparatus in order to help ensure that patterns applied to the substrate are sufficiently sharp.

In order to obtain information at least indicative of (e.g. measure or monitor) a focal property of a lithographic apparatus, such as the focal point or depth of focus, various techniques have been suggested. Some techniques involve the use of two overlaid exposure patterns. Changes in the relative position of the overlaid patterns, in conjunction with appropriate configuration of the lithographic apparatus used for each overlaid exposure, can be used to determine a change in a focal property of the lithographic apparatus. However, since this method involves two overlaid exposures, the exposures themselves have to be aligned with a very high degree of accuracy in order to ensure that any changes in position of the pattern resulting from the exposures are attributable to a change in focal property of the apparatus, and not a change in a pattern alignment property. Furthermore, two exposures are required to undertake this method. It is desirable to minimize the number of exposures required in order to reduce the time that is needed to obtain the necessary information, and to reduce the possibility of any changes arising in the lithographic apparatus between exposures which may affect the shape, or orientation or position of patterns created in an exposure.

Another method which may be used to monitor a focal property of a lithographic apparatus involves using, for example, an uncommon illumination mode, for example, an off-optical-axis single pole illumination mode. It is desirable to use an illumination mode which is commonly used in a lithographic apparatus and method so that as few changes as possible need to be made to the lithographic apparatus in order to obtain information at least indicative of one or more focal properties of the lithographic apparatus.

It is desirable to provide, for example, one or more methods that obviate or mitigate one or more of the problems identified above, or one or more of the problems of the prior art in general, whether identified herein or elsewhere.

SUMMARY

According to an embodiment of the invention, there is provided a method of obtaining information at least indicative of a focal property of a lithographic apparatus, the method comprising: illuminating a patterning device pattern, provided by a patterning device, with a radiation beam having a symmetric illumination mode (e.g. a point symmetric illumination mode), the patterning device pattern comprising a first pattern feature that substantially diffracts radiation constituting at least a portion of the radiation beam, and a second pattern feature that does not substantially diffract radiation constituting at least a portion of the radiation beam; illuminating a phase modulation element with radiation emanating from the patterning device, and introducing an asymmetry, relative to an optical axis, in the substantially diffracted radiation using the phase modulation element; illuminating a radiation beam receiving element with radiation emanating from the phase modulation element to form a receiving element pattern on the receiving element that is related to the patterning device pattern, the receiving element pattern having a first feature that is related to the first pattern feature of the patterning device pattern, and a second feature that is related to the second pattern feature of the patterning device pattern; obtaining positional information regarding the relative positions of the first feature of the receiving element pattern and of the second feature of the receiving element pattern; and determining information at least indicative of the focal property of the lithographic apparatus from the obtained positional information.

Substantially diffracted radiation diffracts to a greater extent than radiation that is not substantially diffracted. In one example, substantially diffracted radiation (e.g. derived from radiation constituting a first pole of the illumination mode) is diffracted such that zeroth, first, second and/or higher diffraction orders (e.g. for that first pole) are spatially separated from one another on the phase modulation element. The substantially diffracted radiation (e.g. for that first pole) may be diffracted such that only a given single diffraction order is incident upon a given single controllable region (discussed in more detail below) of the phase modulation element. For example, one (e.g. a zeroth) diffraction order may be incident upon a first controllable region of the phase modulation element, and another (e.g. a first) diffraction order may be incident upon a second controllable region of the phase modulation element. In one example, radiation that is not substantially diffracted (e.g. derived from radiation constituting a first pole of the illumination mode) may have diffraction orders that are not spatially separated from one another on the phase modulation element, or have diffraction orders that are not substantially spatially separated from one another on the phase modulation element. Radiation that is not substantially diffracted (e.g. for that first pole) may be diffracted such that more than one (e.g. a majority or all) diffraction orders are incident upon a single controllable region (discussed in more detail below) of the phase modulation element. For example, one (e.g. a zeroth) diffraction order may be incident upon a first controllable region of the phase modulation element, and another (e.g. a first) diffraction order may also be incident upon the first controllable region of the phase modulation element.

Using the phase modulation element to introduce an asymmetry relative to an optical axis in the substantially diffracted radiation may comprise: using the phase modulation element to induce a phase shift between first radiation constituting at least a portion of a diffraction order of the substantially diffracted radiation and second radiation constituting a different portion of that same diffraction order such that the first radiation and second radiation combine with radiation constituting at least a portion of another diffraction order to result in a substantially constant level of radiation when illuminating the radiation beam receiving element.

Using the phase modulation element to introduce an asymmetry relative to an optical axis in the substantially diffracted radiation may comprise: using the phase modulation element to induce a phase shift between first radiation constituting at least a portion of a diffraction order of the substantially diffracted radiation and second radiation constituting a different portion of that same diffraction order such that the first radiation and second radiation combine with radiation constituting at least a portion of another diffraction order to ensure that the patterning device pattern which comprises the first pattern feature of the patterning device that substantially diffracts radiation is not imaged onto the radiation beam receiving element.

The first radiation constituting at least a portion of a diffraction order and which is phase shifted may constitute approximately half of the radiation for that diffraction order. The phase shift may be 180°.

The phase shift may be introduced in radiation constituting a diffraction order derived from one of at least two poles of the illumination mode, thus introducing the asymmetry.

The diffraction order may be a zeroth diffraction order.

A zeroth diffraction order and an additional diffraction order of the substantially diffracted radiation may be incident upon the phase modulation element. The zeroth diffraction order and the additional diffraction order may be spatially separated when incident upon the phase modulation element. This allows the phase of a diffraction orders, or a portion of a diffraction order, to be controlled independently of another diffraction order, or other portion of a diffraction order.

Obtaining positional information regarding the relative positions of the first feature of the receiving element pattern and of the second feature of the receiving element pattern may comprise: determining the direction and/or extent of relative movement between the first feature of the receiving element pattern and of the second feature of the receiving element pattern. Determining information at least indicative of the focal property of the lithographic apparatus from the obtained positional information may comprise: determining information at least indicative of the focal property of the lithographic apparatus from the determined direction and/or extent of relative movement between the first feature of the receiving element pattern and of the second feature of the receiving element pattern.

The first pattern feature of the patterning device pattern may comprise a line, and the second pattern feature of the patterning device pattern may comprise a line, the line of the first pattern feature extending parallel to the line of the second pattern feature.

The patterning device pattern may further comprise third and fourth pattern features. The third pattern feature of the patterning device pattern may comprise a line, and the fourth pattern feature of the patterning device pattern may comprise a line, the line of the third pattern feature extending parallel to the line of the fourth pattern feature. The lines of the third and fourth pattern features may extend in a direction perpendicular to the direction in which the lines of the first and second pattern features extend.

The first pattern feature may comprise or be provided with a reference line.

The illumination mode may be a dipole or a quadrupole illumination mode. The illumination mode may be another illumination mode.

The phase modulation element may comprise a controllable region. The controllable region may be controllable to change a refractive index of the controllable region. The controllable region may be controllable by selectively heating the controllable region. The region may be controlled by selectively controlling a shape, position or orientation of the region. This may be particularly applicable to a reflective phase modulation element, for example comprising an array of mirrors.

The focal property may be a focal point of the lithographic apparatus.

The method may further comprise controlling a configuration or position of an element of the lithographic apparatus, or the radiation beam receiving element, in order to take into account the obtained information. The obtained information may be used to adjust the position of a focal point of the lithographic apparatus, and/or to move the radiation beam receiving element to a focal point of the lithographic apparatus.

The radiation beam receiving element may be a substrate, or a detector.

The phase modulation element may be located at or adjacent to a Fourier transform plane (e.g. a pupil plane) of the lithographic apparatus.

It will be understood that substantially diffracted radiation diffracts to a greater extent than radiation that is not substantially diffracted.

According to an embodiment of the invention, there is provided a lithographic arrangement, comprising: an adjuster for providing a radiation beam with a symmetric illumination mode (e.g. a point symmetric illumination mode); a patterning device for receiving the radiation beam and arranged to provide a patterning device pattern, the patterning device pattern comprising a first pattern feature that substantially diffracts radiation constituting at least a portion of the radiation beam, and a second pattern feature that does not substantially diffract radiation constituting at least a portion of the radiation beam; a phase modulation element configured to introduce an asymmetry, relative to an optical axis, in the substantially diffracted radiation; a radiation beam receiving element arranged to receive radiation emanating from the phase modulation element such that, in use, a receiving element pattern is formed on the receiving element that is related to the patterning device pattern, the receiving element pattern having a first feature that is related to the first pattern feature of the patterning device pattern, and a second feature that is related to the second pattern feature of the patterning device pattern; a position detection arrangement configured to obtain positional information regarding the relative positions of the first feature of the receiving element pattern and of the second feature of the receiving element pattern; and a determination configuration for determining information at least indicative of a focal property of the lithographic apparatus from the obtained positional information.

The lithographic apparatus may have, where appropriate, one or more of the features described above in relation to the method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
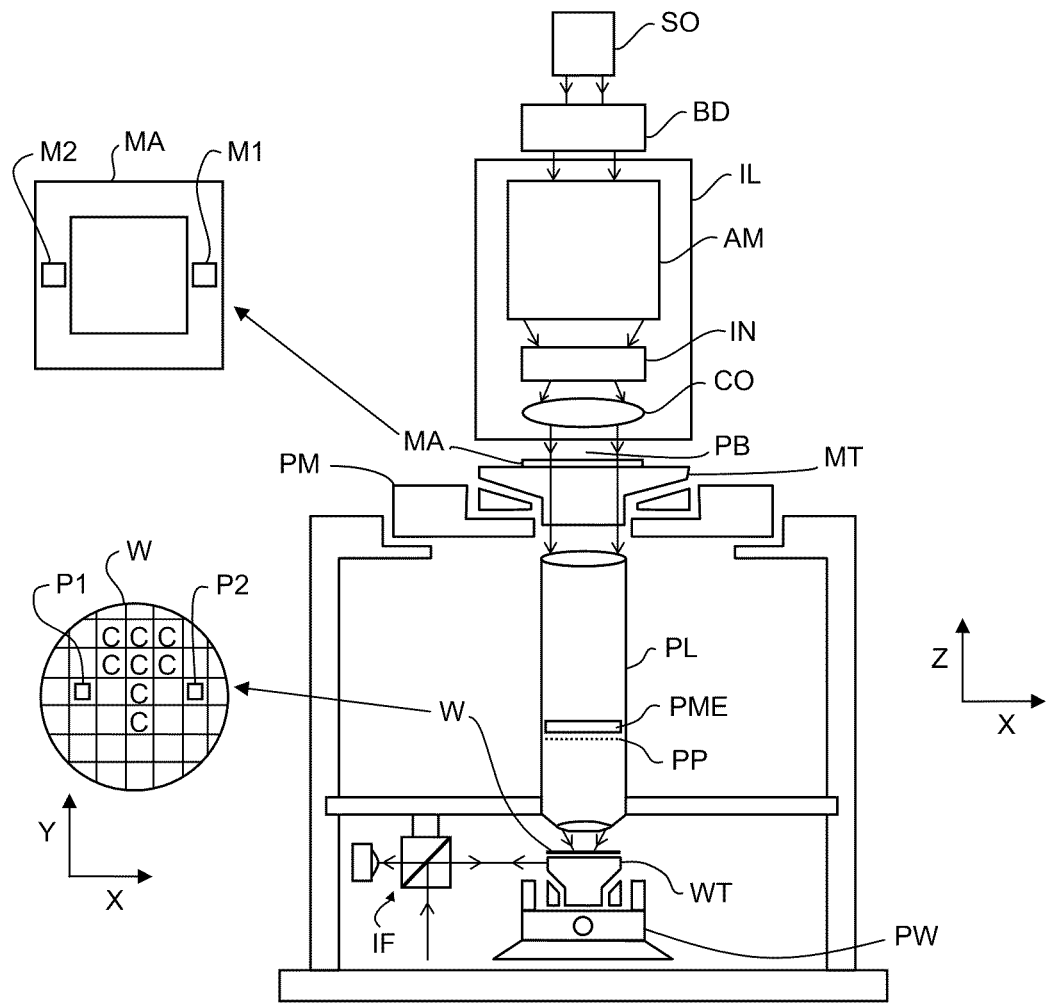
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as, for example, the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or EUV radiation);

a support structure (e.g. a support structure) MT to support a patterning device (e.g. a mask) MA and connected to first positioning device PM to accurately position the patterning device with respect to item PL;

a substrate table (e.g. a wafer table) WT to hold a substrate (e.g. a resist-coated wafer) W and connected to second positioning device PW to accurately position the substrate with respect to item PL;

a projection system (e.g. a refractive projection lens) PL configured to image a pattern imparted to the radiation beam PB by patterning device MA onto a target portion C (e.g. comprising one or more dies) of the substrate W; and a phase modulation element PME located in or adjacent to a pupil plane PP of the projection system PL, the phase modulation element PME being arranged to adjust a phase of at least a part of an electric field of the radiation beam.

As here depicted, the apparatus is of a transmissive type (e.g. employing a transmissive mask). Alternatively, the apparatus may be of a reflective type (e.g. employing a programmable mirror array of a type as referred to above).

A support structure MT holds the patterning device. It holds the patterning device in a way depending on the orientation of the patterning device, the design of the lithographic apparatus, and other conditions, such as for example whether or not the patterning device is held in a vacuum environment. The support structure MT can use mechanical clamping, vacuum, or other clamping techniques, for example electrostatic clamping under vacuum conditions. The support structure MT may be a frame or a table, for example, which may be fixed or movable as required and which may ensure that the patterning device is at a desired position, for example with respect to a projection system. Any use of the terms "reticle" or "mask" herein may be considered synonymous with the more general term "patterning device".

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjuster AM to adjust the angular intensity distribution of the beam (e.g. for providing a desired illumination made in the radiation beam). Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section. An illumination system may encompass various types of optical components, including refractive, reflective, and catadioptric optical components for directing, shaping, or controlling the beam of radiation, and such components may also be referred to below, collectively or singularly, as a "lens".

The radiation beam PB is incident on the patterning device (e.g. mask) MA, which is held on the support structure MT. Having traversed the patterning device MA, the beam PB passes through the projection system PL, which focuses the beam onto a target portion C of the substrate W. In passing through the projection system PL, the beam PB also passes through the phase modulation element PME.

With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
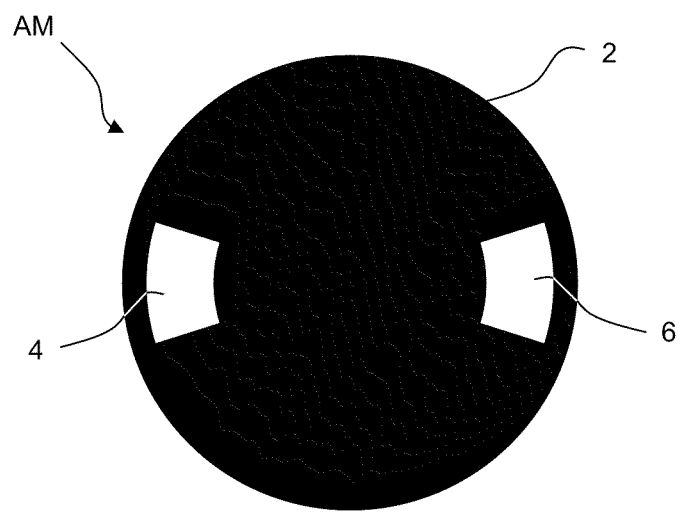
FIG. 2 schematically depicts an adjuster for use in an illuminator of a lithographic apparatus.

FIG. 2 schematically depicts the adjuster AM shown in and described with reference to the illuminator of FIG. 1 in more detail. The adjuster AM comprises a plate 2 that is opaque to radiation constituting the beam of radiation used in the lithographic apparatus. The plate 2 is provided with two annular sections, a first annular section 4 and a second annular section 6. The annular sections 4, 6 allow passage of parts of the radiation beam through the plate 2. A first part of the radiation beam will pass through the first annular section 4, and a second, part of the radiation beam will pass through the second annular section 6. The adjuster AM therefore provides a dipole illumination mode, each pole of the dipole being created by radiation passing through each of the annular sections 4, 6 of the plate 2. It can be seen from FIG. 2 that the illumination mode will be symmetrical, since the annular sections 4, 6 are symmetrically disposed about a center of the plate 2.

It will be appreciated that, for example, the adjuster AM could instead be or comprise a diffractive optical element or a plurality of controllable mirrors.

In accordance with an embodiment of the present invention, a radiation beam having a dipole illumination mode (or another symmetric illumination mode) may be used to illuminate a pattern provided on a patterning device. If the pattern provided by the patterning device has certain particular features having certain dimensions, the pattern can be used to implement a method of obtaining information at least indicative of a focal property of the lithographic apparatus.

Figure 3:
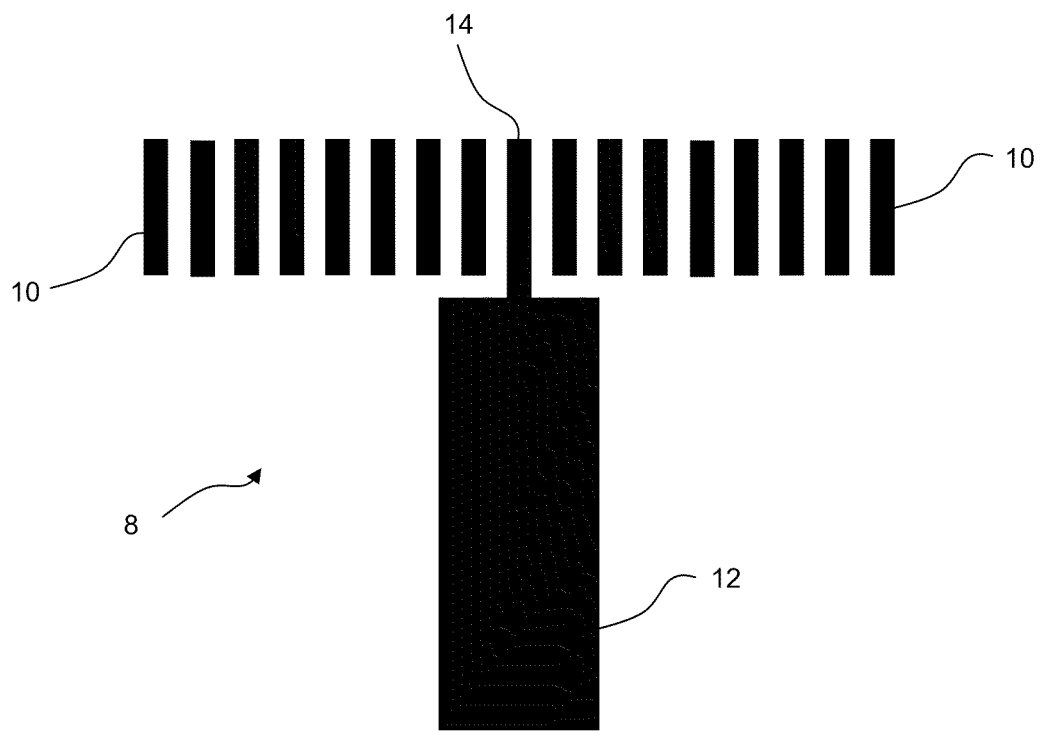
FIG. 3 schematically depicts a pattern with which a patterning device of the lithographic apparatus may be provided in order to, at least in part, obtain information at least indicative of a focal property of the lithographic apparatus, in accordance with an embodiment of the invention.

FIG. 3 shows a pattern 8 that may be provided in a patterning device. The pattern may be provided, for example, using a transmissive reticle or mask, a reflective reticle or mask, or by a patterning device comprising a plurality of individually controllable elements, as is known in the art. The pattern 8 comprises an array of lines 10. The size (linewidth, or width) and spacing of the lines 10 are specifically chosen to substantially diffract radiation constituting at least a portion of the radiation beam described above. For instance, for a radiation beam comprising radiation having a wavelength of 193 nm, the lines 10 may have a width of 100 nm and a spacing in-between the lines 10 may be 100 nm, such that the pitch is 200 nm. A thicker line 12 (where "thicker" refers to having a larger line width than the lines 10) is also provided in the pattern 8. The thicker line 12 extends parallel to the lines 10 of the array of lines. The thicker line 12 is thick enough such that it does not substantially diffract radiation which is incident upon the pattern 8. For instance, in the case of a radiation beam comprising radiation having a wavelength of 193 nm, the thicker line 12 may have a thickness of 1000 nm. As will be described in more detail below, the method of obtaining information at least indicative of a focal property of the lithographic apparatus may involve determining a change (if any) in the relative positions of the thick line 12 and the array of lines 10 in a pattern provided on the substrate or the like (e.g. a radiation beam receiving element, which may not be a substrate, but could instead, for example, be a CCD array). Determining a magnitude of a change in the relative positions of the thick line 12 and the array of lines 10 may be made easier by providing a reference line 14 in the array of lines 10. The reference line 14 is slightly longer than other lines 10 in the array, is joined to the thicker line 12, and may be used as a reference to determine the magnitude of a change in the relative positions of the thick line 12 and the array of lines 10.

Substantially diffracted radiation diffracts to a greater extent than radiation that is not substantially diffracted. In one example, substantially diffracted radiation (e.g. derived from radiation constituting at least a portion of a first pole of the illumination mode) is diffracted such that zeroth, first, second, and/or higher diffraction orders (e.g. for that first pole) are spatially separated from one another on the phase modulation element PME. The substantially diffracted radiation (e.g. for that first pole) may be diffracted such that only a given single diffraction order is incident upon a given single controllable region (discussed in more detail below) of the phase modulation element PME. For example, one (e.g. a zeroth) diffraction order may be incident upon a first controllable region of the phase modulation element PME, and another (e.g. a first) diffraction order may be incident upon a second controllable region of the phase modulation element PME. In one example, radiation that is not substantially diffracted (e.g. derived from radiation constituting at least a portion of a first pole of the illumination mode) may have diffraction orders that are not spatially separated from one another on the phase modulation element PME. Radiation that is not substantially diffracted (e.g. for that first pole) may be diffracted such that more than one (e.g. a majority or all) diffraction orders are incident upon a single controllable region (discussed in more detail below) of the phase modulation element PME. For example, one (e.g. a zeroth) diffraction order may be incident upon a first controllable region of the phase modulation element PME, and another (e.g. a first) diffraction order may also be incident upon the first controllable region of the phase modulation element PME.

Figure 4:
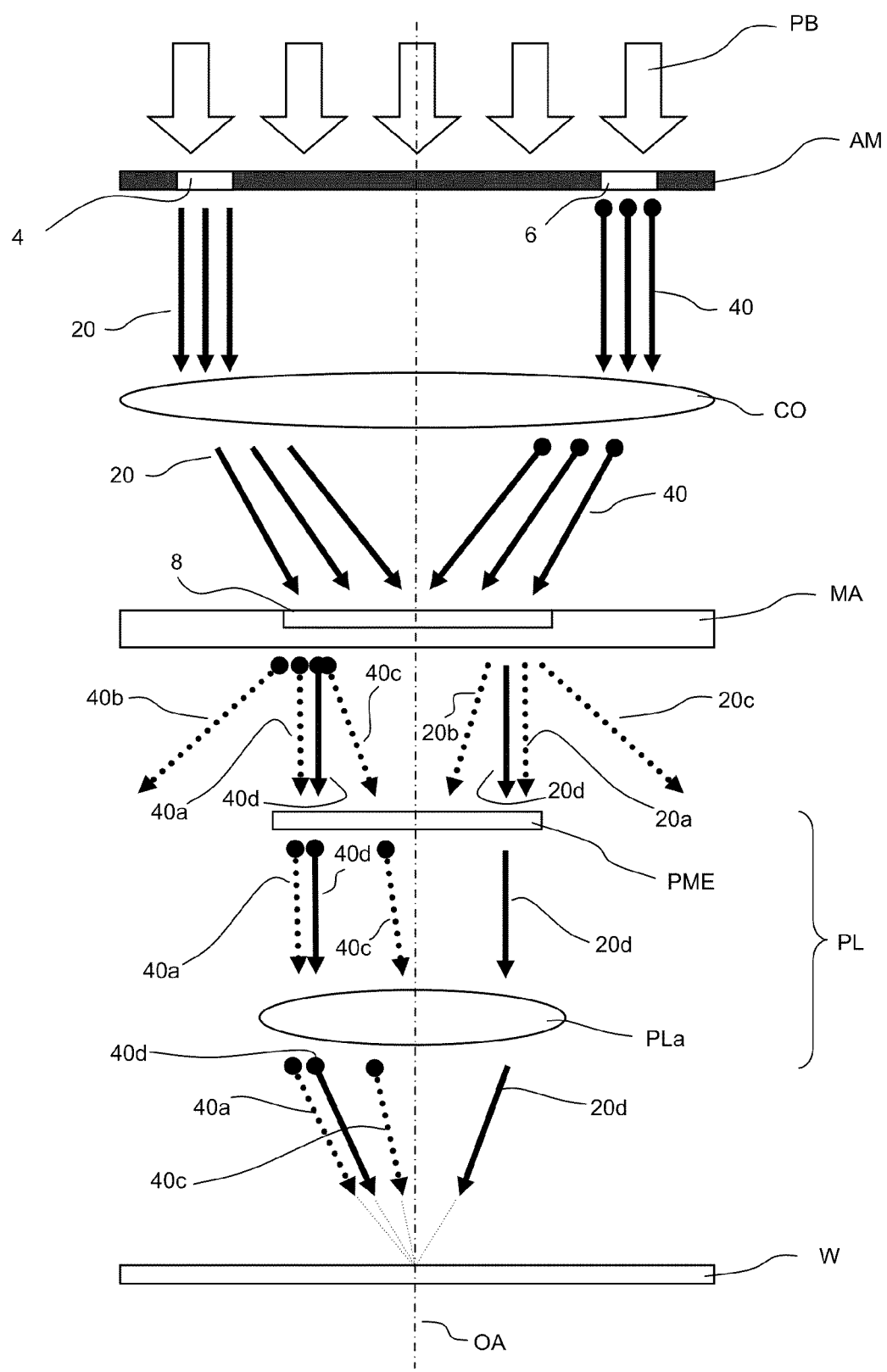
FIG. 4 schematically depicts operating principles of an embodiment of the present invention, with reference to various parts of the lithographic apparatus shown in and described with reference to FIG. 1.

FIG. 4 schematically depicts selected parts of the lithographic apparatus shown in and described with reference to FIG. 1. Referring to FIG. 4, the selected parts, and their functionality are described with reference to an embodiment of the present invention which comprises a method of obtaining information at least indicative of a focal property of the lithographic apparatus. The paths and directions of propagation of various parts of a radiation beam are shown only schematically, and are given to aid the understanding of the embodiment of the present invention. In practice, the exact paths and directions of propagation of those parts of the radiation beam may differ from those shown in the Figure.

Referring to FIG. 4, the radiation beam PB is shown as being incident upon the adjuster AM. The first and second annular sections 4, 6 provided in the adjuster are used to establish a symmetric dipole illumination mode in the radiation beam PB. Radiation passing through the first annular section 4 of the adjuster AM and forming (i.e. constituting) radiation of a first pole of the dipole illumination mode is depicted in the form of arrows 20. Similarly, radiation passing through the second annular section 6 of the adjuster AM and constituting radiation of a second pole of the dipole illumination mode is depicted in the form of arrows 40. In the Figure, and for ease of understanding, a black circle disposed at an opposite end to the head of the arrow is used to indicate radiation that has passed through the second annular section 6 of the adjuster AM. Arrows without the black circle indicate radiation that has passed through the first annular section 4 of the adjuster AM.

The radiation 20 passing through the annular section 4 forms a first pole of the illumination mode. Radiation 40 passing through the second annular section 6 of the adjuster forms a second pole of the illumination mode. Radiation constituting the first and second poles 20, 40 is incident upon a lens, for example the condenser, lens CO described in relation to FIG. 1. The condenser lens CO directs radiation constituting the first and second poles 20, 40 towards the patterning device MA to illuminate the patterning, device MA. Radiation constituting the first and second poles 20, 40 is incident upon and patterned by the pattern 8 (as shown in and described with reference to FIG. 3) of the patterning device MA.

As described above, the pattern 8 comprises an array of lines which substantially diffract radiation constituting at least a portion of the radiation beam PB, and a thicker line which does not substantially diffract radiation constituting at least a portion of the radiation beam PB. Thus it will be appreciated that some radiation passing through the pattern 8 will be substantially diffracted, and some radiation passing through the pattern 8 will not be substantially diffracted. In FIG. 4, radiation constituting a diffraction pattern comprising radiation that has passed through or around, and that has been diffracted by, the array of lines 10 in the pattern 8 is denoted by dotted arrows. Radiation passing through, along or around (and that has been diffracted by, although not substantially diffracted by) the thicker line 12 of the pattern 8 is denoted by arrows having a solid line. The latter radiation is not substantially diffracted, however.

After passing through the pattern 8 in the patterning device MA, the radiation constituting the first pole of the illumination mode, radiation 20, has a number of components, e.g.: a zeroth diffraction order 20$a$, a first (e.g. +1) diffraction order 20$b$, another first (e.g. −1) diffraction order 20$c$, and also a substantially undiffracted portion 20$d$ which corresponds to radiation which has passed through, and has not been substantially diffracted by, the thicker line 12 in the pattern 8. Similarly, after passing through the pattern 8 in the patterning device MA, the radiation constituting the second pole of the illumination mode, radiation 40, has a number of components, e.g.: a zeroth diffraction order 40$a$, a first (e.g. +1) diffraction order 40$b$, another first (e.g. −1) diffraction order 40$c$, and also a substantially undiffracted portion 40$d$ which corresponds to radiation which has passed through, and has not been substantially diffracted by, the thicker line 12 in the pattern 8. Higher diffraction orders will also be present, although these are not depicted in the Figure.

Radiation constituting the first pole of the illumination mode 20$a$-$d$ emanates from the patterning device MA and is, in general, directed towards and illuminates the phase modulation element PME described above. Specifically, the zeroth diffraction order 20$a$ is directed towards substantially the same location on the phase modulation element PME as the substantially undiffracted radiation 20$d$. One first diffraction order 20$b$ is also incident on the phase modulation element PME at a different, spatially separated location to the zeroth diffraction order 20$a$ and the substantially undiffracted radiation 20$d$. Similarly, radiation constituting the second pole of the illumination mode 40$a$-$d$ emanates from the patterning device MA and is, in general, directed towards and illuminates the phase modulation element PME described above. Specifically, the zeroth diffraction order 40$a$ is directed towards substantially the same location on the phase modulation element PME as the substantially undiffracted radiation 40$d$. One first diffraction order 40$c$ is also incident on the phase modulation element PME at a different, spatially separated location to the zeroth diffraction order 40$a$ and the substantially undiffracted radiation 40$d$.

Zeroth diffraction order 20$a$ derived from radiation forming at least a portion of the first pole of the illumination mode has been described as being directed towards substantially the same location on the phase modulation element PME as the substantially undiffracted radiation 20$d$. Arrows in the Figure representing this radiation 20$a$, 20$d$ are slightly separated from one another for clarity, but in practice it will be appreciated that this radiation 20$a$, 20$d$ would have substantially the same path through the lithographic apparatus. Similarly, zeroth diffraction order 40$a$ derived from radiation forming at least a portion of the second pole of the illumination mode has been described as being directed towards substantially the same location on the phase modulation element PME as the substantially undiffracted radiation 40$d$. Arrows in the Figure representing this radiation 40$a$, 40$d$ are slightly separated from one another for clarity, but in practice it will be appreciated that this radiation 40$a$, 40$d$ would have substantially the same path through the lithographic apparatus.

It will be seen in FIG. 4 that in-between the patterning device MA and the phase modulation element PME diffracted radiation is substantially symmetrically distributed about an optical axis OA.

The phase modulation element PME is configured to modulate (e.g. control) the phase, or a change in the phase, of one or more selected parts of radiation incident upon the element PME and transmitted by the element PME. In this particular embodiment, the phase modulation element PME is configured to change the phase of approximately half of the radiation constituting at least a portion of the zeroth diffraction order 20$a$ derived from radiation constituting at least a portion of the first pole of the illumination mode by 180° with respect to the other half of the zeroth diffraction order 20$a$. As will be described below, this phase change results in diffracted radiation derived from radiation forming at least a portion of the first pole not forming an image of the array of pattern lines on the substrate, but instead providing a substantially constant level of background radiation. This is in contrast to diffracted radiation derived from radiation forming at least a portion of the second pole, which undergoes no phase change and which therefore does form an image of the array of pattern lines on the substrate. Therefore, there is introduced an asymmetry in the diffracted radiation about the optical axis OA, and this asymmetry can be taken advantage of, as will be described below. Further, there is introduced a non-telecentricity at substrate level in the diffracted radiation constituting the second pole, which undergoes no phase change and which therefore does form an image of the array of pattern lines on the substrate. This non-telecentricity can be taken advantage of, as will be described below.

When the radiation passes through the phase modulation element PME and is projected onto the substrate W by, for example, a lens PLa of the projection system PL, the overall distribution of diffracted radiation which contributes to the imaging of pattern features is asymmetric and non-telecentric. This is because some components of the radiation will contribute to the formation of the image of the array of pattern feature lines, whereas others will not and will instead provide a constant background. FIG. 4 shows radiation emerging from the phase modulation element PME which contributes to the imaging of the thick line 40d, 20d and the array of lines 40a, 40c (i.e. radiation which has not been subjected to a phase change, or radiation which does not interfere with radiation that has been subjected to a phase change). It will be understood that radiation which does not contribute to the imaging of the array of lines and only provides a background level of radiation, e.g., 20b, will also emanate from the phase modulation element PME and be incident upon the substrate W. However, such radiation is not shown, so as to highlight the asymmetry and non-telecentricity of radiation that is incident on the substrate W and which contributes to the imaging of pattern features on that substrate.

As described in more detail below, the fact that radiation emerging from the phase modulation element PME and which contributes to the imaging of the array of lines 40a, 40c is non-telecentric, and that the substantially non-diffracted components which contribute to the imaging of the thick line 20d, 40d are telecentric, can be taken advantage of to obtain information at least indicative of one, or more focal properties of the lithographic apparatus. Before describing how the one or more focal properties of the lithographic apparatus may be obtained, it is useful to explain how the phases of one or more parts of radiation incident on, and transmitted by, the phase modulation elements PME may be modulated (e.g. controlled).

Figure 5A:
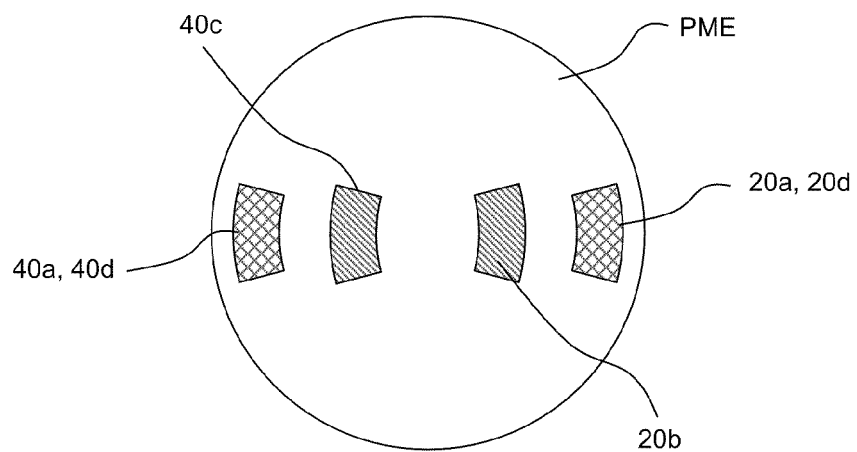
FIGS. 5a to 5c schematically depict a phase modulation element, and its use, according to an embodiment of the present invention.

FIG. 5a shows the phase modulation element PME in plan view. The distribution of radiation that is incident on the phase modulation element PME is also shown. It can be seen that radiation that forms the zeroth diffraction order 20a of radiation derived from the first pole of the illumination mode is incident upon substantially the same region of the phase modulation element PME as the substantially undiffracted radiation 20d. Furthermore, radiation constituting the first diffraction order 20b of radiation derived from the first pole of the illumination mode is spatially separated on the surface of the phase modulation element PME from the zeroth diffraction order 20a and the substantially undiffracted radiation 20d (i.e. they are spaced apart). Furthermore, it can be seen that radiation that forms the zeroth diffraction order 40a of radiation derived from the second pole of the illumination mode is incident upon substantially the same region of the phase modulation element PME as the substantially undiffracted radiation 40d. Furthermore, radiation constituting the first diffraction order 40c of radiation derived from the second pole of the illumination mode is spatially separated on the surface of the phase modulation element PME from the zeroth diffraction order 20a and the substantially undiffracted component 20d (i.e. they are spaced apart). It can be seen that components of radiation derived from the first pole of the illumination mode 20a, 20d, 20c are spatially separated from radiation derived from the second pole of the illumination mode 40a, 40b, 40d. The spatial separation of the radiation components allows the phase of one or more of these components to be individually controlled. In some embodiments, higher diffraction orders (i.e. orders higher than first diffraction orders) may also be incident upon the phase modulation element PME. Such higher orders are not depicted in the Figure.

Figure 5B:
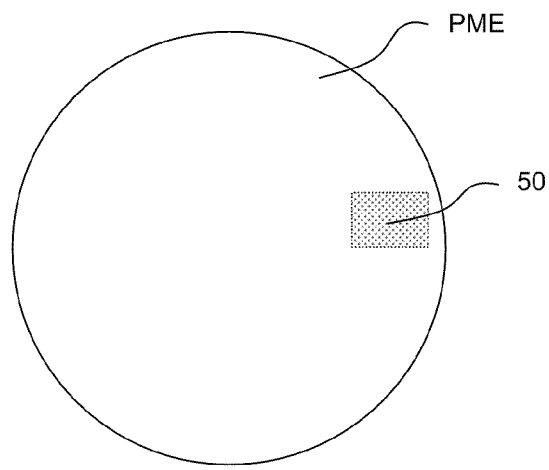

FIG. 5b shows the phase modulation element PME in plan view. A region 50 of the phase modulation element PME may be configured to ensure that radiation passing through that region 50 undergoes a phase shift relative to radiation that has not passed through that region 50. The phase shift (i.e. phase change) could be for example, 180° or any other suitable phase shift. A phase shift of 180° may be used, for example, to introduce an asymmetry (e.g. non-telecentricity) into radiation used to image pattern features onto the substrate. A phase shift of other than 180° may also be used to introduce an asymmetry (e.g. non-telecentricity) into radiation (e.g. diffracted radiation) used to image pattern features onto the substrate (e.g. by manipulating some diffracted radiation to prevent it from imaging pattern features on the substrate). The phase modulation element PME may be used to introduce an asymmetry, relative to an optical axis, in the substantially diffracted radiation. The region 50 may be controlled in order to provide the phase shift, or the region 50 could be a passive region 50 which has been designed to provide the phase shift. Although FIG. 5b shows only one region 50, it will be appreciated that, one or more such regions may be provided on or in the phase modulation element PME in order to be able to control the phase of one or more parts of the radiation beam that is incident upon different areas, and passes through different areas, of the phase modulation element PME.

Figure 5C:
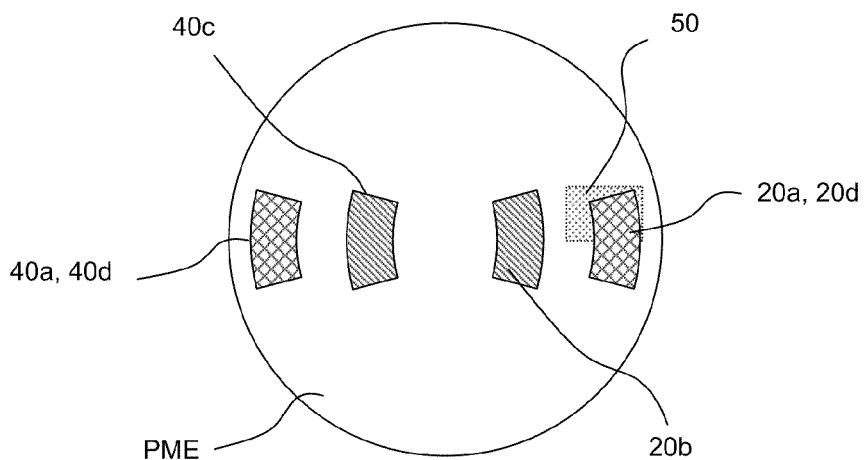

Referring now to FIG. 5c, the distribution of radiation shown in and described with reference to FIG. 5a has been overlaid on top of the phase modulation element PME provided with the region 50. It can be seen that half of the substantially undiffracted radiation 20d and half of the zeroth diffraction order 20a radiation derived from the first pole of the illumination mode is incident upon the region 50. Half of the radiation constituting the zeroth diffraction order 20a radiation and passing through the region 50 will have its phase shifted by 180° relative to the half that does not pass through the region 50. Substantially diffracted first diffraction order radiation 20b, spatially separated from the zeroth diffraction order 20a radiation and the region 50, does not have its phase changed.

In best focus, the zeroth 40a and first 40c diffraction orders of radiation derived from radiation forming at least a portion of the second pole of the illumination mode (which experience no phase shift) will recombine to an image defined by $A/2(1+K\cos(2\pi x/p))$, where A is an average intensity and K is a contrast. In contrast, by introducing a phase shift of 180° in the half (i.e. the top half in the Figure) of the zeroth diffraction order 20a radiation derived from the first pole of the illumination mode, a different image is formed by radiation combining with (i.e. interfering with) the zeroth diffraction order 20a. First order radiation 20b derived from the first pole of the illumination mode will combine with phase shifted zeroth order radiation 20a to contribute a term $A/4(1+K\cos(2\pi x/p))$ to the image in best focus. In contrast, first order radiation 20b derived from the first pole of the illumination mode will combine with non-phase shifted zeroth order radiation 20a to contribute a term $A/4(1-K\cos(2\pi x/p))$ to the image in best focus. Hence the contribution of the diffracted radiation 20a, 20b of the first pole of the illumination mode in this example to the total image is a constant intensity offset of A/2—i.e. there is no variable interference term. The phase modulation results in the non-imaging of pattern features by diffracted radiation derived from radiation forming at least a portion of one pole of the two poles constituting the illumination mode. Any modulation in the image formed on the substrate will therefore be caused by the second pole of the illumination mode only, and thus an asymmetry and non-telecentricity is introduced.

For the substantially non-diffracted radiation 20d that is also incident on the region 50 all diffraction orders are close to the zeroth order and hence experience the same phase-shift due to the phase modulation element. Thus no asymmetry is introduced into the substantially non-diffracted radiation. In summary, radiation not substantially diffracted by the thick line 12 of the pattern of the patterning device and which is incident on the substrate will be telecentric. In contrast, substantially diffracted radiation diffracted by the array of lines 10 of the pattern of the patterning device and which is incident on the substrate will be non-telecentric.

It will be appreciated from the descriptions of FIG. 4 and FIG. 5 that a substantially symmetrical distribution of radiation can be made non-symmetrical, and therefore non-telecentric when incident upon a substrate, by appropriate phase manipulation of diffracted components of that radiation. The use and advantages of such non-telecentric principles will now be described.

Figure 6A:
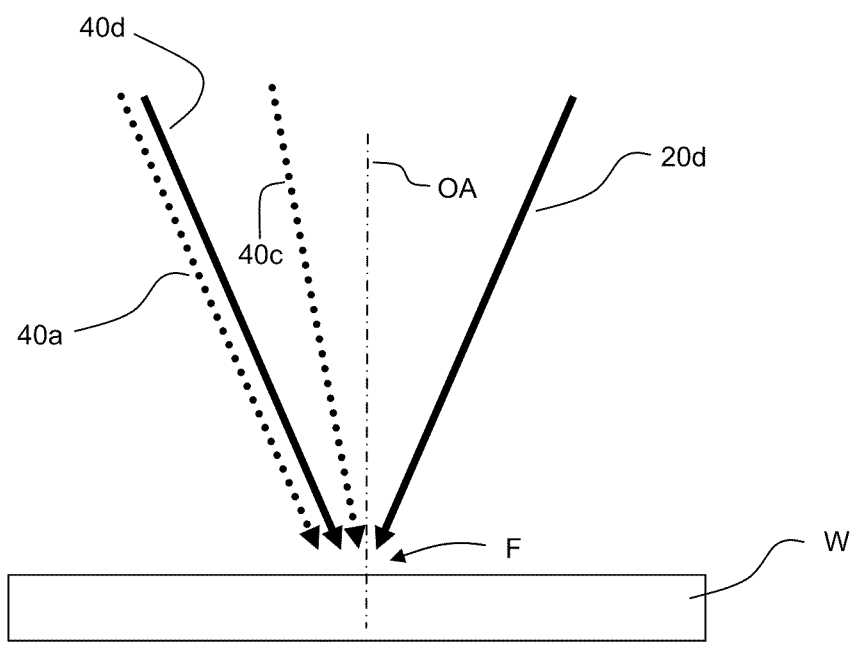
FIGS. 6a and 6b schematically depict an example of exposure of a substrate, in focus, and the effect of that exposure on a pattern provided on the substrate, respectively, according to an embodiment of the present invention.

FIG. 6a schematically depicts the substrate W and various radiation components incident on that substrate W. The components shown are those which contribute to the imaging of pattern features of the patterning device, and not those which only provide a constant background (i.e. the zeroth 20a and first 20b diffraction orders of radiation from the first pole of the illumination mode). The components shown thus comprise: the substantially undiffracted radiation 20d derived from the first pole of the illumination mode; the substantially undiffracted radiation 40d derived from radiation constituting the second pole of the illumination mode; zeroth diffraction order radiation 40a derived from the radiation constituting the second pole of the illumination mode; and first diffraction order radiation 40c derived from the radiation constituting the second pole of the illumination mode.

As discussed above in relation to FIG. 4, it can be seen in FIG. 6a that the substantially undiffracted radiation components 20d, 40d are telecentric, in that they are substantially equal in magnitude and are substantially equally inclined with respect to the optical axis OA (i.e. the substantially undiffracted radiation components 20d, 40d are substantially symmetrically distributed relative to one another about the optical axis OA). Also as discussed above, it can be seen that the diffracted radiation that is incident on the substrate W and which results in a modulation of the intensity (i.e. a contribution to the image of the pattern features) is the zeroth diffraction order radiation 40a combining with the first diffraction order radiation 40c, both derived from the second pole of the illumination mode (i.e. no contribution is present from the first pole of the illumination mode). Thus, the zeroth diffraction order radiation 40a combining with the first diffraction order radiation 40c that is incident on the substrate W gives rise to non-telecentricity in the image (i.e. the effect of the diffracted radiation is not symmetrically distributed about the optical axis OA). For 2-beam (i.e. two pole) imaging as used in the present embodiment, the focus dependent shift is proportional to:
where z $$\frac{z}{\lambda}\left(\sqrt{1-\sigma_0^2} - \sqrt{1-\sigma_1^2}\right)$$

is the focus position, $\lambda$ is the wavelength and $\sigma_{0,1}$ are the positions of the orders 0,1 respectively in the pupil plane.

Figure 6B:
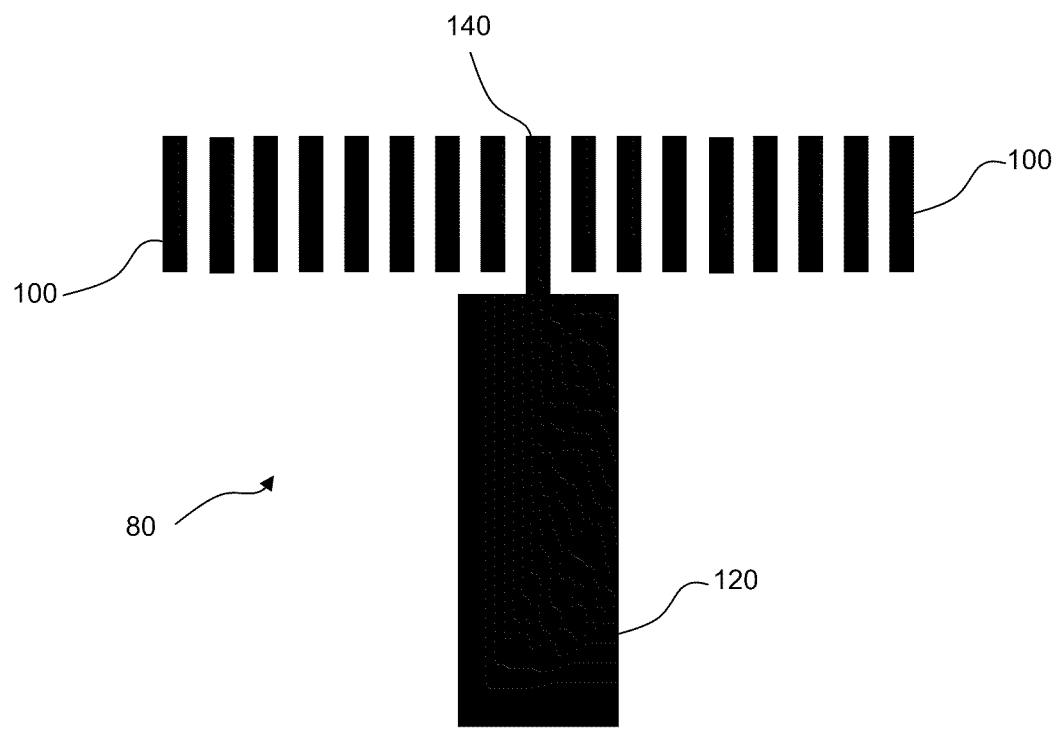

If, as shown in FIG. 6a, the radiation components 20d, 40a, 40c, 40d are focused onto a common focus point F on the substrate W, a pattern may be provided on the substrate W which corresponds to the pattern provided by the patterning device shown in and described with reference to FIG. 3. FIG. 6b shows such a pattern 80 applied to the substrate W. It can be seen that the shape of the pattern corresponds substantially to the shape of the pattern as shown in and described with reference to FIG. 3. It will be appreciated, however, that the exact dimensions of the pattern 80 may be smaller than the pattern shown in and described with reference to FIG. 3, due to a reduction factor associated with imaging a pattern by, for example, the projection system of the lithographic apparatus. Referring back to FIG. 6b, it can be seen that the pattern 80 comprises an array of lines 100. Extending parallel to array of lines is a single thicker line 120. A reference line 140 in the array of lines 100 extends out of the array of lines 100 and towards and into contact with the thicker line 120. As will be discussed in more detail below, relative movement between the array of lines 100 and the thicker line 120 may be determined with reference to the reference line 140.

As discussed above, it is desirable to be able to obtain information at least indicative of (e.g. measure) one or more focal properties of a lithographic apparatus, for example, the focal point and/or depth of focus of the lithographic apparatus. According to an embodiment of the present invention such obtaining of information may be undertaken by obtaining positional information regarding a change (if any) in the position of features forming the pattern shown in and described with reference to FIG. 6b.

As will be described in relation to FIGS. 7 and 8, a change in one or more focal properties of the lithographic apparatus can lead to relative movement between the array of lines 100 and thicker line 120 shown in FIG. 6b. The degree and direction of relative movement can be used to, for example, determine a change in the location of a focal point along the optical axis of a lithographic apparatus, and also, for certain patterns, movement of the focal point in the plane of the substrate. The degree and direction of relative movement can be determined in any appropriate manner, for example using a microscopic arrangement, a digital camera, or any other suitable apparatus.

Referring back to FIG. 6b it can be seen that the thicker line 120 is in alignment with the reference line 140. This is because the radiation components 20d, 40a, 40c, 40d are incident upon the same location on the substrate W, since the focus point F is located on the surface of the substrate W.

Figure 7A:
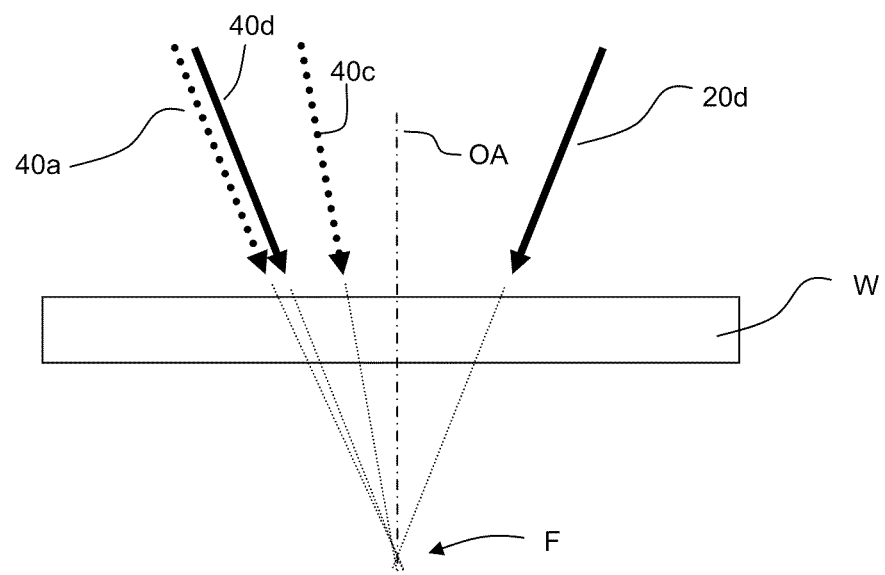
FIGS. 7a and 7b schematically depict an example of exposure of a substrate, out of focus, and the effect of that exposure on a pattern provided on the substrate, respectively, according to an embodiment of the present invention.
Figure 7B:
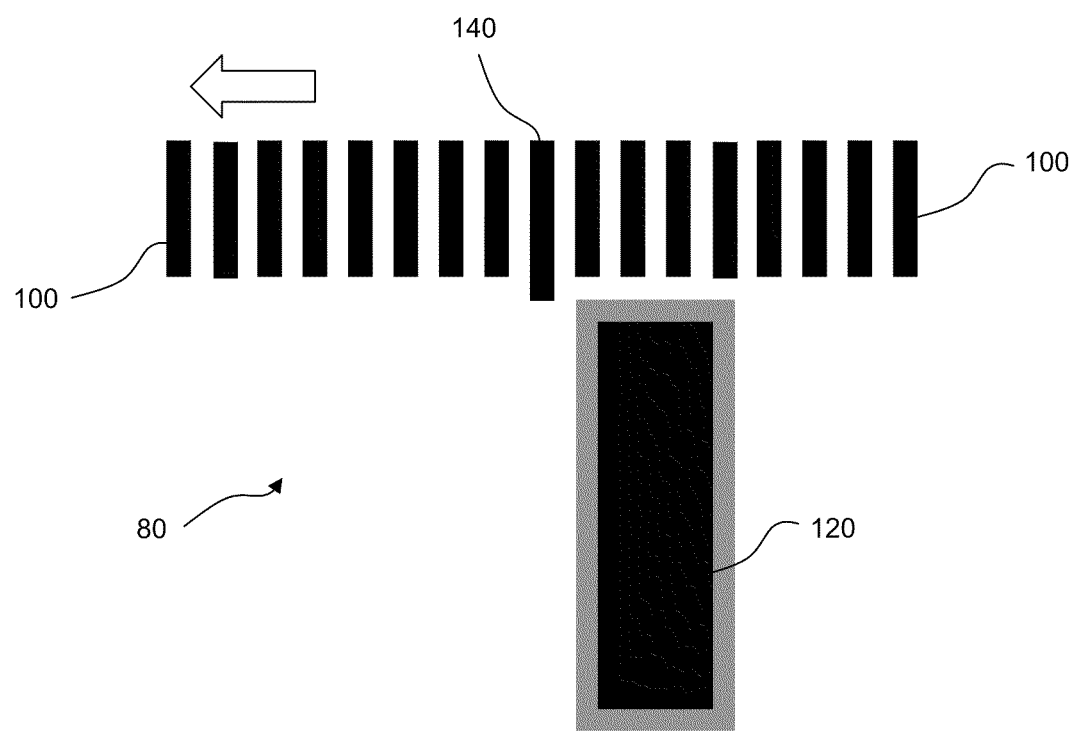

FIG. 7a shows the situation when the focal point of the lithographic apparatus is located beneath the substrate W. FIG. 7b shows the corresponding pattern 80 formed on the substrate when the substrate is illuminated with radiation in the configuration shown in FIG. 7a. Referring to FIG. 7b, it can be seen that the array of lines 100 has moved to the left, relative to the thicker line 120. Movement of the array of lines 100 relative to the thicker line 120 will now be explained.

Referring to FIG. 7a, the substantially undiffracted components of radiation 20d, 40d incident on the substrate W will provide the thicker line 120 of the pattern on the substrate shown in FIG. 7b. Because the substantially undiffracted components 20d, 40d are telecentric with respect to the optical axis OA, movement of the focal point F will not cause movement of the thicker line 120 on the substrate, although the edges, for example, of the thicker line 120 may be slightly out of focus due to movement of the focal point F (shown by the gray). The situation with regard to the array of lines 100 provided on the substrate is, however, quite different.

Radiation used to provide the array of lines 100 has been substantially diffracted by corresponding lines provided in the pattern of the patterning device used to pattern the radiation beam. In combination with appropriate phase modulation as discussed above, this results in the diffracted radiation that is incident upon the substrate W giving a substantially non-telecentric effect. FIG. 7a illustrates this non-telecentric radiation in the form of the zeroth diffraction order radiation 40a and first diffraction order radiation 40c derived from the second pole of the illumination mode (diffracted radiation derived from the first pole of the illumination mode is not shown, as this combines to provide only a constant background intensity, as discussed above). Because of this effective non-telecentricity, movement of the focal point F along the optical axis OA will cause movement of the array of lines 100 on the substrate. The reason for the movement is because diffracted radiation used to image and provide the array of pattern lines 100 is predominantly inclined to the optical axis, and non-telecentic. Because of this inclination and non-telecentricity it can be seen from FIG. 7a that the zeroth diffraction order radiation 40a and first diffraction order radiation 40c will be incident on a different part of the substrate W if there is relative movement between the focal point F and the substrate W along the optical axis OA. This means that a pattern (for example, array of lines 100) formed by the combination of the zeroth diffraction order radiation 40a and first diffraction order radiation 40c will be provided on a different part of the substrate.

Figure 8A:
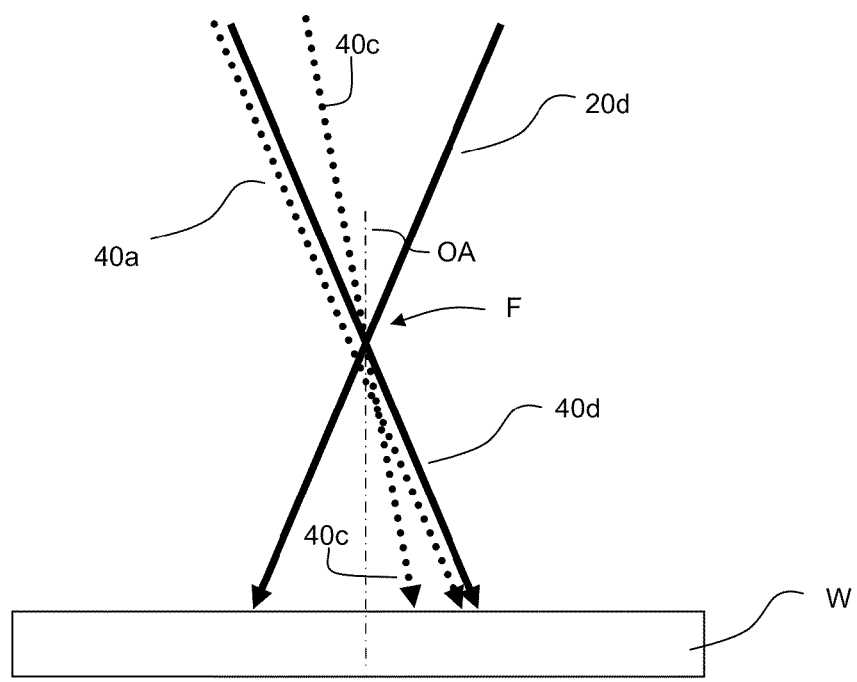
FIGS. 8a and 8b schematically depict an example of exposure of a substrate, out of focus in an opposite direction to that shown in FIG. 7a, and the effect of that exposure on a pattern provided on the substrate, respectively, according to an embodiment of the present invention.
Figure 8B:
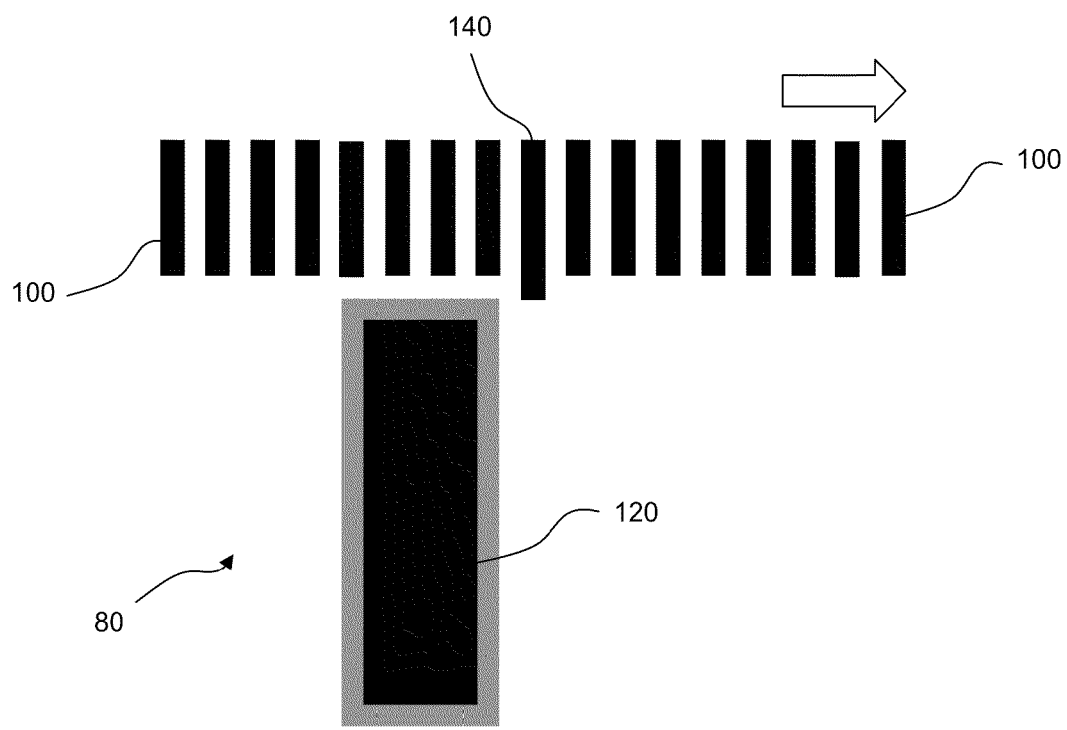

FIG. 8a shows a similar situation to that shown in FIG. 7a, but where the focal point F is now located above the substrate W. It can be seen that the zeroth diffraction order radiation 40a and first diffraction order radiation 40c is incident upon a different part of the substrate in comparison with the situation shown in and described with reference to FIG. 7a. Thus, it can be expected that the array of lines 100 formed by the zeroth diffraction order radiation 40a and first diffraction order radiation 40c will also move on the substrate W. FIG. 8b shows the pattern 80 provided on the substrate, and shows that the array of pattern lines 100 has moved to the right of the thicker line 120.

It will be appreciated from a review of FIGS. 6, 7, and 8 that a focal property of the lithographic apparatus can be determined by identifying positional changes in patterns or pattern features provided on the substrate. For instance, it will be appreciated from FIGS. 7 and 8 that movement of the focal point above or below the substrate can be identified from movement of the array of lines 100 provided in the pattern on the substrate to the right or left of a thicker line 120, respectively. The magnitude of the change in the focal point may be determined, for example, using one or more calibration routines or the like. For instance, the focal point and/or the substrate can be moved to ensure that the focal point is located on the surface of the substrate. The focal point and/or the substrate can then be moved along the optical axis to induce positional changes in the array of lines provided on the substrate relative to the thicker line. An understanding of how the positional changes in pattern features corresponds to changes in the focal point can then be established, and used in future to be able to determine changes in the focal point. The reference line provided in the pattern provides a convenient reference point from which the magnitude of movement relative to the thicker line can be determined.

Embodiments of the invention are advantageous, since they allow information to be obtained that is at least indicative of a focal property of the lithographic apparatus to be determined using only a single exposure, and using common (e.g. symmetric) illumination modes. The information is described as being 'at least indicative' because the obtained information may not actually be the magnitude of the focal property, or of a change in that property, but may instead be related to that magnitude or change in magnitude. Other advantages are that the method may make use of simple pattern features (e.g. a binary feature such as lines and the like), that field dependent information can be deduced, and that the effective non-telecentricity is large, which makes the method sensitive to a change in a focal property.

In summary, an embodiment of the present invention is method of obtaining information at least indicative of a focal property of a lithographic apparatus. The method comprises illuminating a patterning device pattern, provided by a patterning device, with a radiation beam having a symmetric illumination mode (e.g. dipole, quadrupole). The patterning device pattern comprises a first pattern feature (e.g. one or more lines) that substantially diffracts radiation constituting at least a portion of the radiation beam, and a second pattern feature (e.g. one or more lines) that does not substantially diffract radiation constituting at least a portion of the radiation beam. The method further comprises illuminating a phase modulation element with radiation emanating from the patterning device. Using the phase modulation element, an asymmetry is introduced, relative to an optical axis, in the substantially diffracted radiation (e.g. by appropriate phase manipulation of diffracted radiation and thus manipulation of the combination/interference of diffracted radiation to prevent imaging of a pattern feature (e.g. an array of lines) by one or more poles of an illumination mode). A radiation beam receiving element (e.g. a substrate, a CCD array, or a general detection arrangement) is illuminated with radiation emanating from the phase modulation element in order to form a receiving element pattern on the receiving element. The receiving element pattern is related to the patterning device pattern, the receiving element pattern having a first feature that is related to the first feature of the patterning device pattern, and a second feature that is related to the second feature of the patterning device pattern. Positional information regarding the relative positions of the first feature of the receiving element pattern and of the second feature of the receiving element pattern is then obtained (e.g. using a camera, a microscope, pattern recognition apparatus, or the like). Information at least indicative of the focal property of the lithographic apparatus is then determined from the obtained positional information (e.g. by comparing the obtained positional information with previous data or measurements, or from known relationships between a positional change and a change in the focal property).

As well as (or further to) obtaining information at least indicative of a focal property of the lithographic apparatus, an embodiment of the present invention comprises controlling a configuration of the lithographic apparatus or the substrate (e.g. the position or orientation of one or more elements of the lithographic apparatus, or the substrate) in order to take into account the obtained information. For example, the obtained information may be used to adjust the focal point of the lithographic apparatus, and/or to move the substrate to the focal point.

A further embodiment of the present invention is a lithographic arrangement, comprising an adjuster to provide a radiation beam with a symmetric illumination mode (e.g. dipole, quadrupole). The lithographic arrangement also comprises a patterning device (e.g. a mask, a reticle, or an array of individually controllable elements) to receive the radiation beam and which is arranged to provide a patterning device pattern (i.e. that is used to pattern the radiation beam). The patterning device pattern comprises or provides a first pattern feature (e.g. one or more lines) that substantially diffracts radiation constituting at least a portion of the radiation beam, and a second pattern feature (e.g. one or more lines) that does not substantially diffract radiation constituting at least a portion of the radiation beam. The lithographic arrangement further comprises a phase modulation element configured to introduce an asymmetry, relative to an optical axis, in the substantially diffracted radiation (e.g. by appropriate phase manipulation of diffracted radiation and thus manipulation of the combination/interference of diffracted radiation to prevent imaging of a pattern feature (e.g. an array of lines) by one or more poles of an illumination mode). A radiation beam receiving element (e.g. a substrate, or detector) is also provided, and is arranged to receive radiation emanating from the phase modulation element such that, in use, a receiving element pattern is formed on the receiving element that is related to the patterning device pattern. The receiving element pattern has a first feature that is related to the first feature of the patterning device pattern, and a second feature that is related to the second feature of the patterning device pattern. The lithographic arrangement further comprises a position detection arrangement (e.g. comprising or being a camera, a microscope, pattern recognition apparatus, or the like) configured to obtain positional information regarding the relative positions of the first feature of the receiving element pattern and of the second feature of the receiving element pattern. Finally, the lithographic arrangement is provided with a determination configuration (e.g. a computational device or the like) to determine information at least indicative of a focal property of the lithographic apparatus from the obtained positional information (e.g. by comparing the obtained positional information with previous, data or measurements, or from known relationships between a positional change and a change in the focal property).

In the above embodiments, the pattern provided by the patterning device has been described as providing a pattern comprising an array of thin lines adjacent to a single thick line. An embodiment of the invention is applicable to other patterns of different shapes and sizes, so long as one pattern feature substantially diffracts radiation and another pattern feature does not substantially diffract radiation. For example, a pattern feature configured to not substantially diffract radiation may comprise one or more lines which may form a rectangle or square (e.g. a box like structure). A box formed from thicker lines which do not substantially diffract radiation forming the radiation beam may enclose an array of thin lines which do substantially diffract radiation forming the radiation beam.

Figure 9:
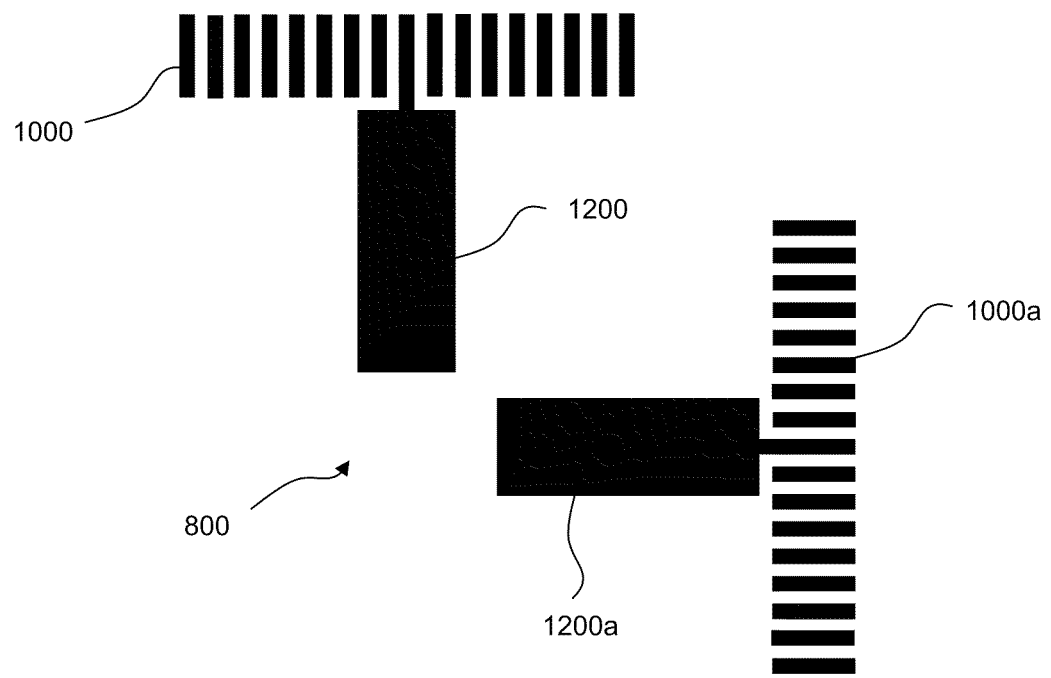
FIG. 9 schematically depicts another pattern with which a patterning device of the lithographic apparatus may be, provided in order to, at least in part, obtain information at least indicative of a focal property of the lithographic apparatus, in accordance with an embodiment of the invention.

In the above described embodiments, the array of lines and the thicker line have been shown as extending in the same direction. Additional information regarding a focal property of the lithographic apparatus may be obtained by providing one or more additional patterns which, for example, diffract radiation in a direction substantially perpendicular to radiation diffracted by the patterns described above. FIG. 9 shows such a pattern 800. The first part of the pattern comprises a first array of lines 1000, and also a first thicker line 1200 located adjacent to and parallel to the array of lines 1000. A second part of the pattern comprises a further similar array of lines 1000a, and a further thicker line 1200a located adjacent and parallel to the array of lines 1000a. The further array of lines 1000a and further thicker line 1200a are oriented at 90° with respect to the first array of lines 1000 and first thicker line 1200. The pattern shown in FIG. 9 may diffract radiation into two different directions that are perpendicular to with respect to one another. Such diffraction may allow movement of pattern features provided on a substrate in corresponding different perpendicular directions, thus allowing a change in (for example) the focal point to be determined not only toward and away from the substrate, but in a plane parallel to the surface of the substrate.

Figure 10:
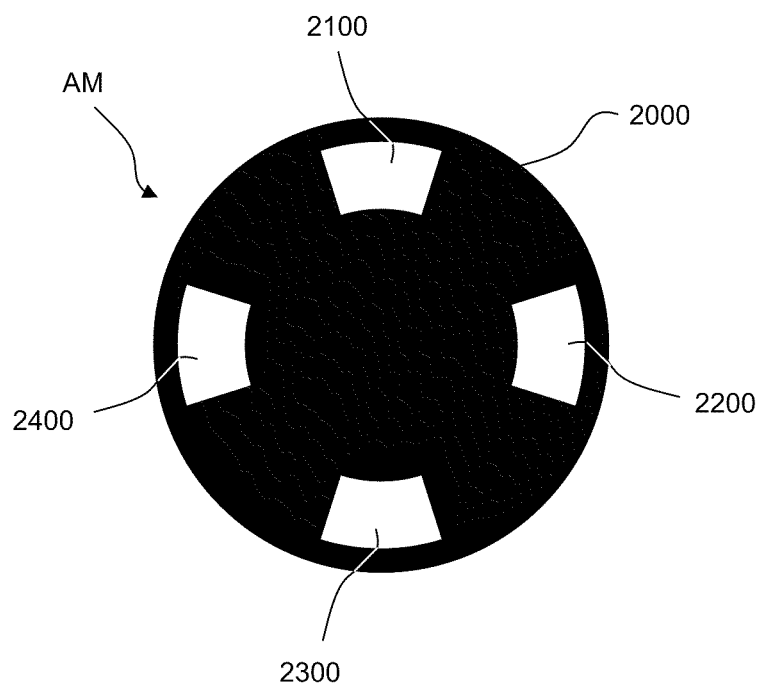
FIG. 10 schematically depicts an adjuster in accordance with a further embodiment of the present invention.

In order to realise or promote diffraction in two different directions of radiation incident on the pattern shown in FIG. 9, a different symmetrical illumination mode to that described above may be required. For example, a symmetrical quadrupole illumination mode may be more appropriate, being used to illuminate the patterning device from additional directions relative to a dipole illumination mode. FIG. 10 shows such a quadrupole illumination mode. FIG. 10 shows the adjuster AM. The adjuster AM comprises a plate 2000 which is substantially opaque to radiation constituting the radiation beam used in the lithographic apparatus. The plate 2000 is provided with four annular apertures or openings 2100, 2200, 2300 and 2400. The annular apertures 2100, 2200, 2300 and 2400 are spaced equally around the plate 2000 in order to provide in a radiation beam a symmetrical quadrupole illumination mode, as is known in the art. The method described above may be applied to such a quadrupole illumination mode by phase shifting a portion (e.g. a half) of zeroth diffraction order radiation (or another diffraction order) derived from one pole of each pair of diametrically opposed poles that form the four poles of the quadrupole illumination mode.

The adjuster described herein is given by way of example only. Other adjuster are equally applicable, and may even be preferred. For example, the adjuster may comprise a plurality of controllable mirrors, or a diffractive optical element. Such an alternative adjuster may be more efficient than a plate provided with apertures, as such a plate may absorb or block more radiation than a plurality of controllable mirrors, or a diffractive optical element.

In the above embodiments, a patterning device through which a radiation beam passes (or off which a radiation beam is reflected) has been described that provides one or more pattern features that are configured to substantially diffract a part of the radiation beam, and one or more pattern features that are configured to not substantially diffract a part of the radiation beam. It will be appreciated that this is a functional limitation and that the exact dimensions or range of dimensions of such pattern features will vary depending on the wavelength or wavelengths of radiation that are used to form the radiation beam used in or by the lithographic apparatus.

In the above embodiments, a phase modulation element has been described. The phase modulation element may be configured so that certain parts of the phase modulation element are arranged to change the phase of certain parts of one or more components of a radiation beam incident upon (and/or passing through) the phase modulation element. The configuration may be actively controlled or be passively provided (e.g. pre-set) in the phase modulation element. The phase modulation may be undertaken by appropriate control of the configuration of, for example, a transmissive phase modulation element or of a reflective phase modulation element (e.g. a flexible mirrored surface or a mirrored surface comprising an array of moveable mirrored facets or the like).

Figure 11:
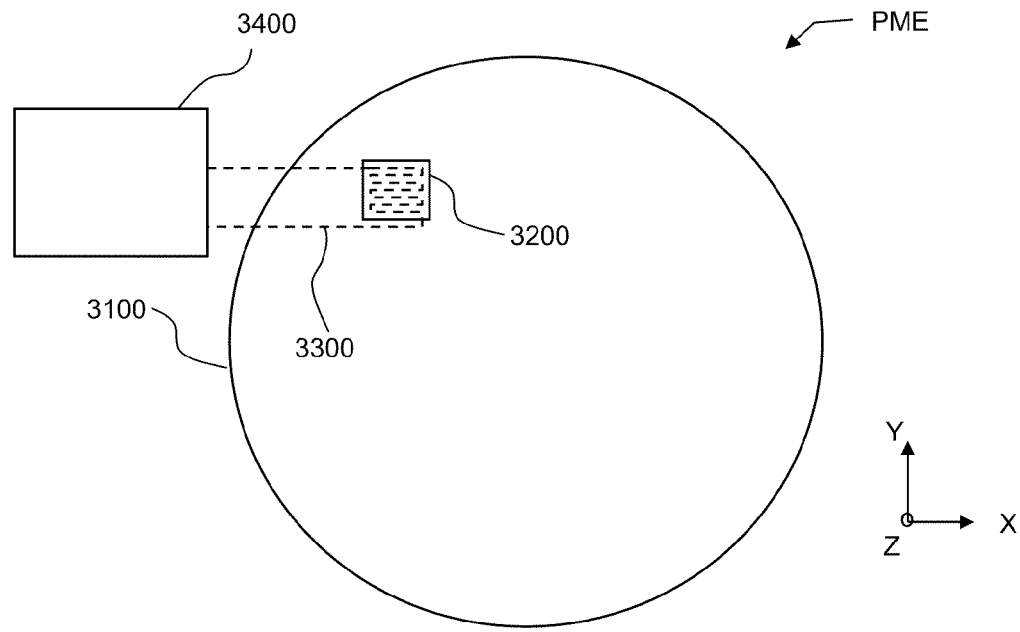
FIG. 11 schematically depicts a more detailed view of an embodiment of the phase modulation element shown in and described with reference to FIGS. 1 and 4.
Figure 12:
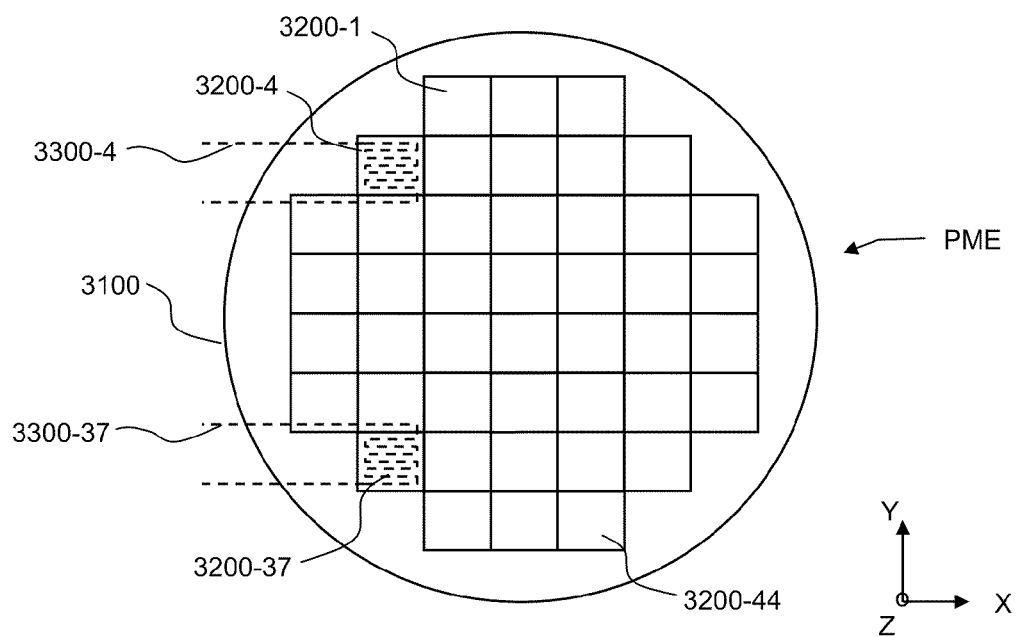
FIG. 12 schematically depicts further detail of the embodiment of the phase modulation element shown in and described with reference to FIG. 11.

FIGS. 11 and 12 depict specific embodiments of a suitable phase modulation element. The phase modulation element PME may comprise an optical element 3100 formed from material substantially transmissive for radiation constituting the radiation beam used in the lithographic apparatus. The phase modulation element may also comprise, or be in connection with, a controller 3400. An optical path length for a wave passing through the optical element 3100 is adjustable in response to a signal provided by the controller 3400. The optical element 3100 may be disposed, for example, in a Fourier transform plane (e.g. a pupil plane) of, for example, the projection system of the lithographic apparatus. Such a location would mean that, in use, the optical element 3100 is traversed by radiation (e.g. substantially diffracted and substantially non-diffracted) emanating from the patterning device. An adjustment (i.e. modulation) of a phase of a wave traversing the optical element 3100 may be achieved by applying heat to a region 3200 of the optical element 3100, thereby introducing a local change in the index of refraction of material constituting the optical element relative to the refractive index of material adjacent to and surrounding the region 3200. The application of heat may be achieved by, for example, transmitting an electrical current through a wire 3300 having Ohmic resistance and being arranged in contact with the region 3200 of the optical element 3300. The controller 3400 is arranged to provide the (correct level of) current to the wire 3300 to achieve a desired change in the refractive index of the region 3200 and therefore modulation of the phase of the wave passing through the region 3200.

A plurality of, for example, adjacent portions of the optical element 3100 may be provided with a corresponding plurality of wires for heating one, more, or all regions of the optical element 3100 independently from any other region. FIG. 12 schematically depicts an example of such an arrangement. FIG. 12 shows the optical element 3100. Adjacent regions 3200-1 up to 3200-44 are disposed in adjacent rows and, in the Figure, from left to right and from top to bottom. Each region 3200 of the regions 3200-1 up to 3200-44 is provided with a corresponding heating wire 3300-1 up to 3300-44. FIG. 12 schematically depicts only a few of these heating wires 3300-1 up to 3300-44 for clarity, although it will be understood that heating wires would in practice be provided for each, or a plurality, of the regions 3200-1 up to 3200-44.

The controller 3400 is constructed and arranged so that each wire 3300-1 up to 3300-44 can be current-activated independently. This enables application of a spatial phase distribution to one or more optical waves (e.g. components of a radiation beam) traversing the optical element 3100. As discussed above in relation to FIG. 4 and FIG. 5 this spatial phase distribution may be used to manipulate specific parts of one or more components of a radiation beam passing through the phase modulation element in order to, for example, manipulate the combining of (i.e. interference of) components of that radiation beam. Such manipulation may be used to introduce an asymmetry and non-telecentricity into the distribution of the (e.g. diffracted) radiation beam about an optical axis.

It will be appreciated that the phase modulation element may be formed from or comprise any suitable number or regions, and that the number is not necessarily limited to 44. The number of regions may, in general, depend on a desired special resolution of phase change that is desired in the lithographic apparatus. For example, a ratio of the area of each of the regions of the phase modulation element to the size of a clear area in the pupil plane may be between 100 and 1000. Other embodiments of a phase modulation element can be seen in, for example, U.S. patent application publication no. US 2008-0123066. It will be appreciated that the phase modulation element may be reflective instead.

While specific embodiments of the invention have been described above, it will be appreciated that the invention may be practiced otherwise than as described. The description is not intended to limit the invention, the invention being limited by the claims that follow.

The invention claimed is:

1. A method of obtaining information at least indicative of a focal property of a lithographic apparatus, the method comprising: illuminating a patterning device pattern, provided by a patterning device, with a radiation beam having a symmetric illumination mode, the patterning device pattern comprising a first pattern feature that substantially diffracts radiation constituting at least a portion of the radiation beam, and a second pattern feature that does not substantially diffract radiation constituting at least a portion of the radiation beam; illuminating a phase modulation element with radiation emanating from the patterning device, and introducing an asymmetry, relative to an optical axis, substantially only in the substantially diffracted radiation using the phase modulation element; illuminating a radiation beam receiving element with radiation emanating from the phase modulation element to form a receiving element pattern on the receiving element that is related to the patterning device pattern, the receiving element pattern having a first feature that is related to the first pattern feature of the patterning device pattern, and a second feature that is related to the second pattern feature of the patterning device pattern; obtaining positional information regarding the relative positions of the first feature of the receiving element pattern and of the second feature of the receiving element pattern; and determining information at least indicative of the focal property of the lithographic apparatus from the obtained positional information, wherein using the phase modulation element to introduce an asymmetry relative to an optical axis in the substantially diffracted radiation comprises: using the phase modulation element to induce a phase shift between first radiation constituting at least a portion of a diffraction order of the substantially diffracted radiation and second radiation constituting a different portion of that same diffraction order such that the first radiation and second radiation combine with radiation constituting at least a portion of another diffraction order to result in a substantially constant level of radiation when illuminating the radiation beam receiving element.

2. The method of claim 1, wherein the phase shift is introduced in radiation constituting a diffraction order derived from one of at least two poles of the illumination mode, thus introducing the asymmetry.

3. The method of claim 1, wherein the diffraction order is a zeroth diffraction order.

4. The method of claim 1, wherein a zeroth diffraction order and an additional diffraction order of the substantially diffracted radiation are incident upon the phase modulation element.

5. The method of claim 4, wherein the zeroth diffraction order and the additional diffraction order are spatially separated when incident upon the phase modulation element.

6. A method of obtaining information at least indicative of a focal property of a lithographic apparatus, the method comprising: illuminating a patterning device pattern, provided by a patterning device, with a radiation beam having a symmetric illumination mode, the patterning device pattern comprising a first pattern feature that substantially diffracts radiation constituting at least a portion of the radiation beam, and a second pattern feature that does not substantially diffract radiation constituting at least a portion of the radiation beam; illuminating a phase modulation element with radiation emanating from the patterning device, and introducing an asymmetry, relative to an optical axis, substantially only in the substantially diffracted radiation using the phase modulation element; illuminating a radiation beam receiving element with radiation emanating from the phase modulation element to form a receiving element pattern on the receiving element that is related to the patterning device pattern, the receiving element pattern having a first feature that is related to the first pattern feature of the patterning device pattern, and a second feature that is related to the second pattern feature of the patterning device pattern; obtaining positional information regarding the relative positions of the first feature of the receiving element pattern and of the second feature of the receiving element pattern; and determining information at least indicative of the focal property of the lithographic apparatus from the obtained positional information, wherein using the phase modulation element to introduce an asymmetry relative to an optical axis in the substantially diffracted radiation comprises: using the phase modulation element to induce a phase shift between first radiation constituting at least a portion of a diffraction order of the substantially diffracted radiation and second radiation constituting a different portion of that same diffraction order such that the first radiation and second radiation combine with radiation constituting at least a portion of another diffraction order to ensure that the patterning device pattern which comprises the first pattern feature of the patterning device that substantially diffracts radiation is not imaged onto the radiation beam receiving element.

7. A lithographic arrangement, comprising:
  an adjuster to provide a radiation beam with a symmetric illumination mode;
  a patterning device to receive the radiation beam and arranged to provide a patterning device pattern, the patterning device pattern comprising a first pattern feature that substantially diffracts radiation constituting at least a portion of the radiation beam, and a second pattern feature that does not substantially diffract radiation constituting at least a portion of the radiation beam;
  a phase modulation element configured to introduce an asymmetry, relative to an optical axis, substantially only in the substantially diffracted radiation;
  a radiation beam receiving element arranged to receive radiation emanating from the phase modulation element such that, in use, a receiving element pattern is formed on the receiving element that is related to the patterning device pattern, the receiving element pattern having a first feature that is related to the first pattern feature of the patterning device pattern, and a second feature that is related to the second pattern feature of the patterning device pattern;
  a position detection arrangement configured to obtain positional information regarding the relative positions of the first feature of the receiving element pattern and of the second feature of the receiving element pattern; and
  a determination configuration to determine information at least indicative of a focal property of the lithographic apparatus from the obtained positional information.

* * * * *